United States Patent
Huguet

(10) Patent No.: US 10,262,085 B2
(45) Date of Patent: Apr. 16, 2019

(54) METHODOLOGY FOR DETERMINING CURVES OF PRODUCTIVITY OF WELLS FOR EXPLOITING UNDERGROUND GAS STORAGE AND UNDERGROUND NATURAL RESERVOIR OF COMPRESSIBLE FLUIDS

(71) Applicant: Storengy, Bois-Colombes (FR)

(72) Inventor: Frederic Huguet, Fosses (FR)

(73) Assignee: Storengy, Bois-Colombes (FR)

( * ) Notice: Subject to any disclaimer, the term of this patent is extended or adjusted under 35 U.S.C. 154(b) by 495 days.

(21) Appl. No.: 14/441,582

(22) PCT Filed: Nov. 5, 2013

(86) PCT No.: PCT/FR2013/052627
§ 371 (c)(1),
(2) Date: May 8, 2015

(87) PCT Pub. No.: WO2014/072627
PCT Pub. Date: May 15, 2014

(65) Prior Publication Data
US 2015/0310141 A1    Oct. 29, 2015

(30) Foreign Application Priority Data
Nov. 8, 2012    (FR) .................... 12 60579

(51) Int. Cl.
*G06F 17/10*    (2006.01)
*G06F 17/50*    (2006.01)
*E21B 47/10*    (2012.01)

(52) U.S. Cl.
CPC .......... *G06F 17/5009* (2013.01); *E21B 47/10* (2013.01); *G06F 17/10* (2013.01)

(58) Field of Classification Search
None
See application file for complete search history.

(56) References Cited

U.S. PATENT DOCUMENTS 8,694,297 B2    4/2014    Ding et al.
8,775,141 B2 *  7/2014    Raphael ............... E21B 43/00
                                                        703/10

(Continued)

FOREIGN PATENT DOCUMENTS

WO    2009/082564 A1    7/2009

OTHER PUBLICATIONS

Tabbone et al. A New Shape Descriptor Defined on the Radon Transform Computer Vison and Image Understanding 102, 2006 pp. 42-51.*

(Continued)

*Primary Examiner* — Rehana Perveen
*Assistant Examiner* — Cuong V Luu
(74) *Attorney, Agent, or Firm* — Eversheds Sutherland (US) LLP

(57) ABSTRACT

The invention relates to a characterization method for characterizing the performance of wells in a stockpile or deposit of compressible fluid, the method comprising the steps of:
obtaining a plurality of operating points (400);
defining a family of operating models (IPa, IPb);
for each model of a family, enumerating (410) those points of the plurality of points that are reproduced by said model; and
for managing said stockpile or deposit, selecting (420) at least one model (M) from the family of models on the basis of at least the result of the enumeration step.

20 Claims, 4 Drawing Sheets

(56) References Cited

U.S. PATENT DOCUMENTS

| | | | |
|---|---|---|---|
| 8,788,209 B2* | 7/2014 | Foot | G01V 11/00 |
| | | | 702/12 |
| 8,818,777 B2* | 8/2014 | Howell | E21B 49/00 |
| | | | 703/10 |
| 2002/0120429 A1 | 8/2002 | Ortoleva | |
| 2003/0173072 A1* | 9/2003 | Vinegar | B09C 1/02 |
| | | | 166/66.5 |
| 2003/0192693 A1* | 10/2003 | Wellington | E21B 41/0064 |
| | | | 166/267 |
| 2005/0149307 A1* | 7/2005 | Gurpinar | E21B 43/00 |
| | | | 703/10 |
| 2005/0197805 A1* | 9/2005 | Eryurek | G05B 23/0272 |
| | | | 702/188 |
| 2008/0103743 A1* | 5/2008 | Howell | E21B 47/00 |
| | | | 703/10 |
| 2009/0157590 A1* | 6/2009 | Mijares | E21B 43/00 |
| | | | 706/61 |
| 2009/0276100 A1 | 11/2009 | Malki et al. | |
| 2010/0286522 A1* | 11/2010 | Beach | A61B 5/02007 |
| | | | 600/441 |
| 2010/0299125 A1 | 11/2010 | Ding et al. | |
| 2011/0040536 A1* | 2/2011 | Levitan | E21B 49/00 |
| | | | 703/2 |
| 2011/0067857 A1* | 3/2011 | Underhill | E21B 43/26 |
| | | | 166/250.01 |
| 2011/0119037 A1* | 5/2011 | Rashid | E21B 43/12 |
| | | | 703/2 |
| 2014/0039793 A1* | 2/2014 | Querales | E21B 43/122 |
| | | | 702/6 |
| 2014/0163368 A1* | 6/2014 | Rousso | A61B 6/037 |
| | | | 600/436 |
| 2018/0023373 A1* | 1/2018 | Calvert | E21B 43/00 |

OTHER PUBLICATIONS

Al-Attar et al. A General Approach for Deliverability Calculations of Gas Wells Journal of Petroleum Science and Engineering 67, 2009, pp. 97-104.*

Fekete Analysis Method www.fekete.com/software/rta/media/webhelp/c-teanalysis.htm, Dec. 26, 2010.*

Maravi New Inflow Peformance Relationships for Gas Condensate Reservoirs Office of Graduate Studies of Texas A&M University, Aug. 2003.*

PCT Search Report for PCT Application No. PCT/FR2013/052627 dated Feb. 3, 2014 (2 pages).

PCT Written Opinion for PCT Application No. PCT/FR2013/052627 (14 pages).

Chinese Office Action for CN Application No. 201380069860.4 dated May 17, 2017 (4 pages, English translation).

* cited by examiner

METHODOLOGY FOR DETERMINING CURVES OF PRODUCTIVITY OF WELLS FOR EXPLOITING UNDERGROUND GAS STORAGE AND UNDERGROUND NATURAL RESERVOIR OF COMPRESSIBLE FLUIDS

CROSS REFERENCE TO RELATED APPLICATIONS

This application claims the priority benefit of PCT/FR2013/052627 filed Nov. 5, 2013 and French Application No. 1260579 filed Nov. 8, 2012. The contents of these applications are hereby incorporated by reference in their entirety.

TECHNICAL FIELD AND PRIOR ART

The invention lies in the field of wells working underground stockpiles of compressible fluids or working hydrocarbon deposits, which may be natural deposits in a porous medium or shale gas or artificial storage. By way of example, the stockpiles under consideration may involve storage in aquifers or in depleted deposits.

In this field, it is useful to characterize as well as possible the performance (or productivity) of hydrocarbon deposits or wells in order to obtain better technical control and better economic working.

A stockpile is shown in FIG. 1. It comprises a reservoir 1, and there can be seen a deposit well 2 that is used via a manifold to measure a deposit pressure, and also a working well 3, along which the gas travels, whether incoming or outgoing.

Conventionally, use is made of a two-dimensional space for characterizing the operation of the stockpile, with performance curves being plotted in this space. The space that is commonly in use is the space of $(Q; \Delta P^2)$ points, where Q is the incoming or outgoing fluid flow rate of the working well and $\Delta P^2$ is the difference between the squares of the pressure Pm measured at the outlet from the working well 3 and the pressure Pg of the stockpile at rest, or the deposit pressure, as represented by the pressure measured in the deposit well 2.

Measurements are taken on the working well 3 at different flow rates and the corresponding points are plotted in this space. One such space is shown in FIG. 2, where the abscissa axis is graduated in cubic meters per hour (m³/h) and the ordinate axis is graduated in bar squared (bar²). The cloud of points 10 constitutes the set of measurements that are available and in use.

A certain amount of dispersion is generally to be observed in the measurements, typically due to measurement errors, to interference between wells, to hydration of wells, to inflow of water, and also to changes in performance over the course of time.

The existence of such dispersion has the consequence of making interpretation of the measurements an operation that is complex and that requires defined procedures, possibly involving a qualified human operator.

Nevertheless, it is generally possible to determine a mathematical model for taking these measurements into account, and to be in a position to extrapolate the behavior of the stockpiles to other circumstances.

Typically, the mathematical model used is a model in which the productivity curves are represented in the $(Q; \Delta P^2)$ space by a parabolic function of ordinate at the origin that is equal to 0 and of slope at the origin that is positive, which function is commonly written as follows:

$$\Delta P^2 = IPa \cdot Q + IPb \cdot Q^2$$

using two (positive) coefficients written IPa and IPb that are referred to as productivity coefficients. One such function is given reference 15 for the cloud of points 10.

Productivity coefficients are physically functions of the characteristics of the stockpile subsoil. They are used as input data for controlling stockpiles and deposits.

In order to determine them, one method consists in manually adapting these coefficients for each well of the stockpile, and optionally for various different filling levels of the stockpile.

That method involves a highly qualified human operator regularly performing an operation that is tricky, difficult to evaluate, and likely to be perceived as depending on the operator.

Another method is to calculate the productivity coefficients by linear regression, by searching for a linear relationships between $\Delta P^2/Q$ and Q. The model is then evaluated by an algorithm in the $(Q; \Delta P^2/Q)$ space.

That method suffers from two drawbacks: firstly in the absence of constraints on the values of the coefficients, it is possible to obtain values that are outliers as a result of noise in the measured values. Furthermore, negative values are often obtained for the coefficient IPa if the measured pressure Pg of the deposit well is unrepresentative or if it is contaminated by interference between wells.

In summary, determining productivity coefficients is difficult, not very practical, and remains contaminated by error. There remains a need for a method that is easy to perform and reliable. However in the field in question, there is no technological or scientific trend that might suggest any particular change to existing methods.

In a totally different field, the Radon transform is known (J. Radon, "On the determination of functions from their integrals along certain manifolds 1917", in "The Radon transform and some of its applications", Appendix A, John Wiley & Sons, 1983), which transform is a mathematical operation that is used in particular for reconstructing medical images obtained by X-ray tomography. One such application of the Radon transform is shown in FIG. 3, where there can be seen the bijective link between a structure in a section plane, specifically a medical image 20, and the measurements 25 (sinogram) made at different observation angles by the tomography apparatus.

The Radon transform, and also the inverse operation known as the inverse Radon transform, are used in medical imaging and in certain specific techniques in the seismic survey or radar detection fields. Thus, in the seismic survey field, the Radon transform is used to decompose an observed wave field into plane waves, thereby facilitating signal analysis.

In general manner, the purpose of the Radon transform is to convert data from a polar coordinate system to a Cartesian coordinate system through curvilinear integrals along straight lines identified in polar coordinates.

There have not been any proposals or suggestions to use this mathematical operation in the field of optimizing the calculation of gas stockpile productivity, a field that is very different from the fields in which the Radon transform is applied. It should be observed in particular that optimizing the calculation of stockpile productivity is never performed by methods using polar coordinates, and that in this field it is discrete data that is processed, in the form of clouds of points, and not continuous data as occurs in medical imaging or in seismic surveying.

DEFINITION OF THE INVENTION AND THE ASSOCIATED ADVANTAGES

In this context the invention constitutes a breakthrough in working stockpiles of compressible fluid, since it provides a method of characterizing the performance of a stockpile of compressible fluid, the method comprising the following steps:

obtaining a plurality of operating points;
defining a family of operating models;
for each model of a family, enumerating those points of the plurality of points that are reproduced by said model; and
for managing said stockpile, selecting at least one model from the family of models on the basis of at least the result of the enumeration step.

The method is effective and reproducible in making one or more models available for managing the stockpile. The method is based on discrete enumeration that, intellectually speaking, is related to the integrations performed when applying the Radon transform to continuous data. The method is not limited to using an enumeration (or an integration or a sum) along a straight line, nor is it limited to using polar coordinates. The method does not stem in any way from the prior art relating to methods of characterizing the performance of a stockpile, nor from the prior art relating to Radon transforms, which are two fields that are very far apart and that have constraints that are different. Concrete progress is proposed.

For example, the points are viewed in a space of points, the abscissa of the point being proportional to a working flow rate and the ordinate of the point being proportional to the difference between the square of a pressure of a working well and the square of a deposit or stockpile well at rest. That constitutes a space for characterizing operation that is known and practical for professionals, as mentioned above.

In certain embodiments, the family of models has, as parameters, two or at least two real numerical values. For example, the models of the family are linear models, or alternatively the defining and enumerating steps comprise applying the Radon transform to the plurality of points. In this latter variant, it is possible for example to make the space of experimental data continuous by pixelizing it.

In other embodiments, the family of models has, as parameters, three real numerical values. For example, the models of the family are parabolic models or hyperbolic models.

According to an advantageous characteristic, the enumeration result is weighted so as to be greater if the points reproduced by the model are dispersed along the model. When performing selection, this makes it possible to prefer models that are corroborated by experimental points over a greater range of values. For example, the result of enumerating may be weighted in a manner that is proportional to the sum of the variances of the distances of the coordinates of the points around the model.

Depending on the methods used, the selection is made in a manner that is automatic, at least in part, or manual, at least in part, by a human operator. Optionally, the selection comprises identifying at least one maximum of the result of enumerating.

The invention thus proposes a method of controlling flow rates or pressure of a stockpile of compressible fluid by using a model selected by a characterization method as described above. The characterization may be performed by a service specialized in processing data coming from stockpiles, or with the help of specialized software. The results can then be used for control purposes, which may be done by third parties, in particular by an operator.

The invention also provides a computer program including instructions that, when executed by a processor, can lead to the above-mentioned characterization method being performed.

The invention is described below in detail with reference to the figures.

It is specified that these figures are given by way of illustration, and should not be interpreted as putting limitations on the invention.

DESCRIPTION OF IMPLEMENTATIONS OF THE INVENTION

In the invention, a cloud (or set) of measurement points are analyzed, these measurement points corresponding to the operation of a stockpile of natural gas or of some other compressible fluid.

The description begins with the general model used for analyzing the measurements taken on stockpiles, in certain implementations of the invention. As mentioned in the introduction, this model associates the difference between pressures squared $\Delta P^2$ (where $\Delta P^2 = |Pm^2 - Pg^2|$, Pm and Pg being the working well pressure and the deposit well pressure, respectively), with the working flow rate, whether drawing off or filling, which is written Q. The model is defined by the following equation:

$$\Delta P^2 = IPa \cdot Q + IPb \cdot Q^2 + IPc \quad (1)$$

An additive measurement correction may be applied to Pg, but it is not described in the present document in order to simplify the equation.

On first analysis, it is often considered that $P^2 = 0$ if $Q = 0$, which means that $IPc = 0$. Thus, on this assumption, the point $(Q = 0, Pm = Pg)$ constitutes an operating constraint for the model.

On this assumption, equation (1) can therefore be written as follows:

$$\Delta P^2 / Q = IPa + IPb \cdot Q \quad (2)$$

Figure 1:
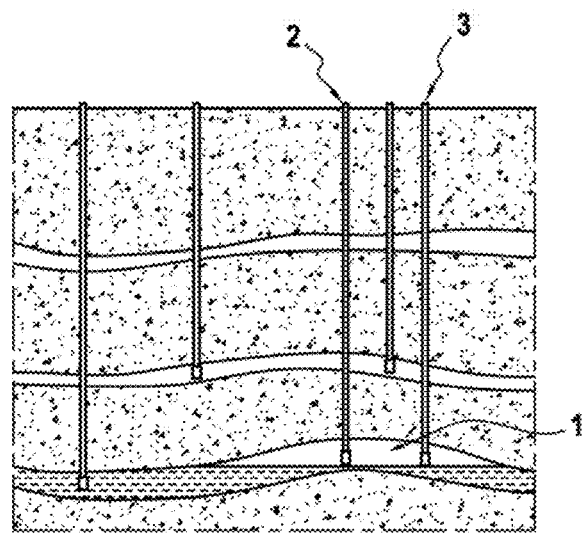
FIG. 1, mentioned above, shows a natural gas stockpile.
Figure 2:
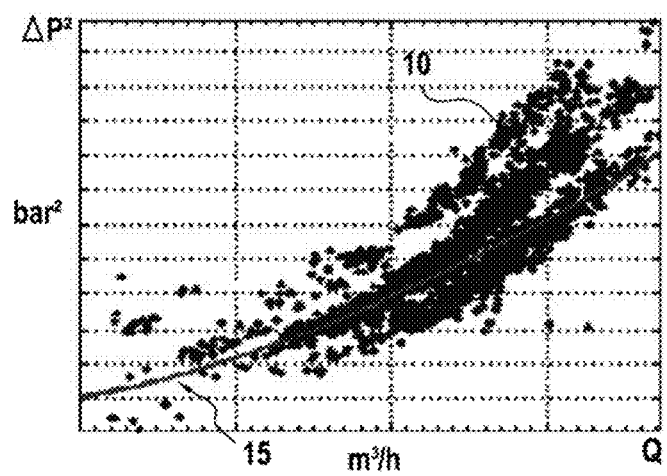
FIG. 2, mentioned above, shows the prior art processing of measurements taken on a stockpile.
Figure 3:
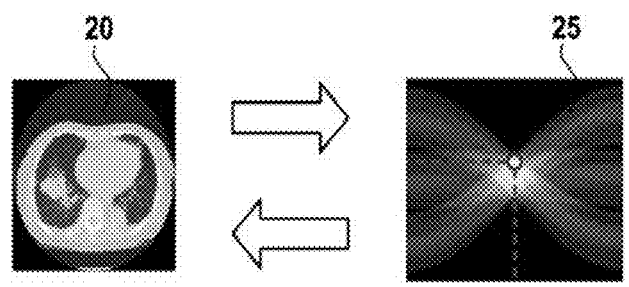
FIG. 3, mentioned above, shows a field of application of the Radon transform.
Figure 4:
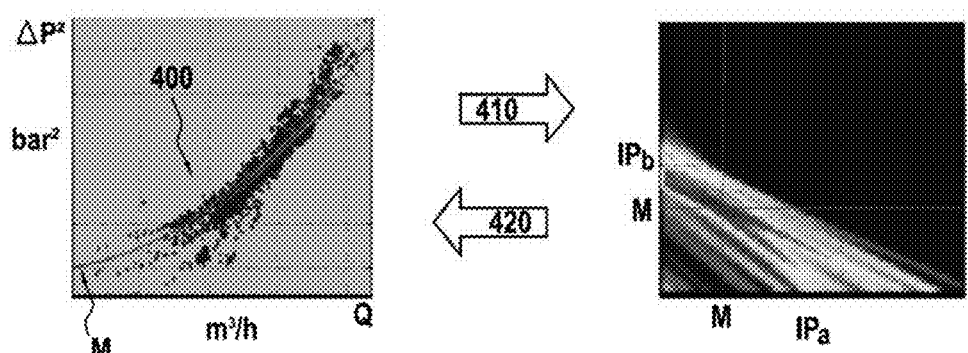
FIG. 4 shows how measurements taken on a stockpile are processed in a first implementation of the invention.

The first implementation of the invention is based on this equation, referred to as a linear model. An implementation is shown in FIG. 4. In the left-hand portion of the figure, a cloud of points 400 is shown using the usual visual representation in the $(Q; P^2)$ space. In this first implementation, a human operator selects bottom and top bounds for the coefficients IPa and IPb, and for each pair of coefficients (IPa; IPb) in compliance with these bounds, consideration is given to the equation:

$$y = IPa + IPb \cdot x$$

The number of points in the cloud of points that are reproduced by the model with a given margin of error is enumerated. For this purpose, the number of points having a distance (not shown) from the straight line under consideration that is less than a predetermined value in the (Q; $\Delta P^2/Q$) space is enumerated. It is possible for this enumeration to be performed while evaluating the distance in a different way, e.g. in the (Q; $\Delta P^2$) space, without thereby going beyond the invention.

This enumeration consists in integrating these points, each point being given the same weight, which constitutes an operation that is intellectually similar to the curvilinear integrals of the Radon transform as used in other fields.

In order to take account of the distribution of points along the straight line under consideration, the result of the enumeration may optionally, but advantageously, be multiplied by the sum of the variance, as evaluated over the entire cloud of points, of the distances to the model for each of the points along the Q axis, and the variance, as evaluated over the entire cloud of points, of the distances to the model for each of the points along the $\Delta P^2/Q$ axis.

The value that is obtained is representative of the match between the model and the cloud of points, and in the implementation in which the result is weighted by the above-mentioned sum of the variances, this value is greater if the cloud of points is spread along the model.

During a step 410, for each pair (IPa, IPb), the result of the enumeration, possibly weighted as mentioned above, is transferred in the form of the intensities associated with the corresponding points into the (IPa; IPb) value space, as shown in the right-hand portion of the figure. On a graphics interface, use is made of a color code or of brightness in order to represent the resulting intensities.

This method is repeated for all of the values of IPa and IPb within the limits determined by the minimum and maximum bounds for these variables, and the representation shown in the right-hand portion of the figure is obtained in which zones of different intensities appear. In this example, the high intensity zones are complex in shape, with several tails attached to a central zone, defining several classes of models that can be envisaged for the cloud of points.

During a step 420, a human operator or an algorithm then proceeds, on the basis of the intensities in the (IPa; IPb) space, to select one or more points (specifically a point marked M) corresponding to one or more models of the cloud of points in compliance with equation (2), e.g. by identifying a maximum. The selection is made in order to manage the deposit or the stockpile under consideration. The model is then used by specialists in controlling stockpiles for performing operations of managing the stockpile.

Figure 5:
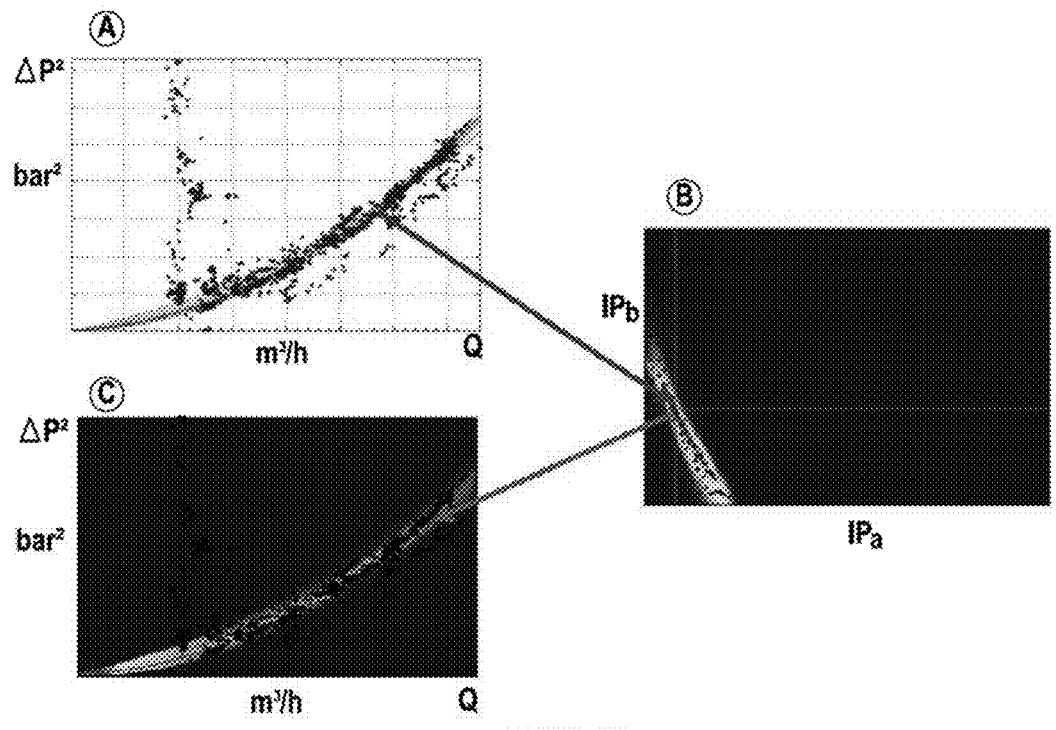
FIG. 5 shows another example of how measurements are processed in the invention.

FIG. 5 shows an implementation of the same method with other measurement values.

In portion A of the figure, the cloud of points is shown in the (Q; $\Delta P^2$) space. It can be seen that there is considerable dispersion among points having low values of Q (low flow rates), with this being due in this example to the stockpile being flooded.

It is specified that the modeling method by linear regression known in the prior art is not effective on this cloud of points because of this dispersion.

Portion B of the figure shows the intensity values obtained for the models under study in the (IPa; IPb) space. The shapes of the high intensity zones in this example are simple, with only one crest zone, thus making it possible for example to perform a simple process of pointing to the intensity maximum, either by a human or automatically.

The portion A of the figure shows a plurality of models having a good match with the cloud of points, as can be seen from the intensity values that appear in portion B of the figure.

Thereafter, in portion C of the figure, it is proposed to retranspose the intensity values into the (Q; $\Delta P2$) space. To do this, it is possible to begin by using the value 0 to replace the intensity values of points in the (IPa; IPb) space for which intensity is less than a selected value, which amounts to excluding models of low pertinence.

Thereafter, a transform is applied that is the inverse of the previously applied transform. The curves in the (Q; $\Delta P2$) graph corresponding to the (IPa; IPb) points of non-zero intensity are shown with an intensity value (color or brightness on the graphics interface) equal to the intensity value of the point (IPa, IPb). For a pixelized representation of the (Q; $\Delta P^2$) space, each pixel shows the sum of the intensities of the points (IPa; IPb) of the corresponding curves that pass through the pixel.

In the portions A and C of the figure, it can be seen that the selected models are not impacted by the dispersion of points for low values of Q (low flow rates), which in this example are due to the stockpile flooding, as mentioned above.

The advantages that stem from the method of the invention compared with prior art methods can thus clearly be seen.

Figure 6:
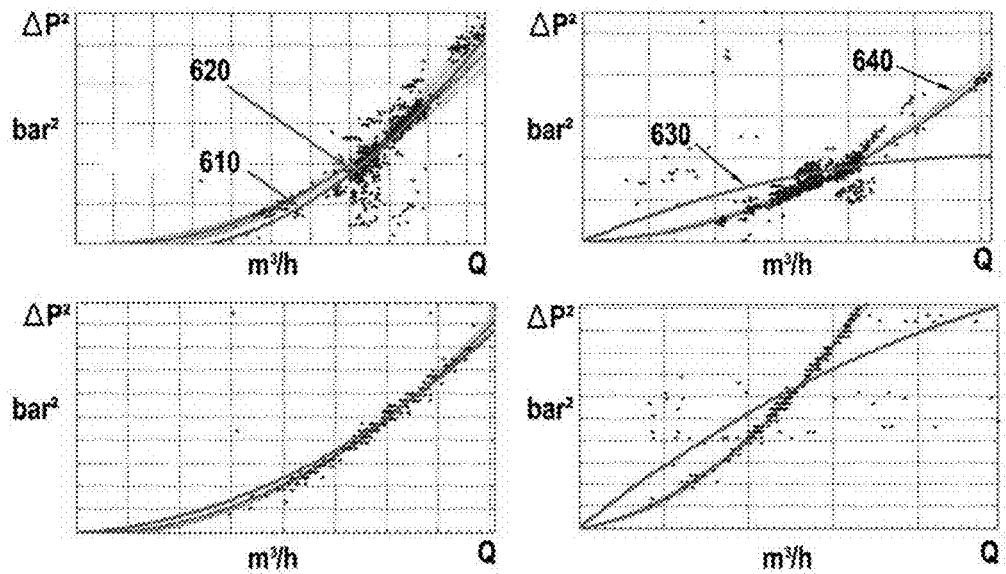
FIG. 6 shows a comparative study of results obtained using the invention and using the prior art.

FIG. 6 involves four different clouds of points and shows the results obtained by a prior art method, specifically in this example the linear regression method, and the results obtained by the method of the invention. The clouds of points are shown in the (Q; $\Delta P^2$) space.

In the top left portion of the figure, there can be seen a cloud of points together with the curve 610 obtained by the prior art method using linear regression in the (Q; $\Delta P^2/Q$) space, together with the curves 620 obtained by the process of the invention of performing the transform followed by inverse transform. In this example, the curve 610 obtained by the prior art method is satisfactory, in particular because it does not constitute an outlier solution. However it can be seen that the set of curves 620 obtained by the invention provide information that is rich and of great interest for the operator who obtains, by means of the invention, an idea about the uncertainty of the performance model.

In the bottom left portion of the figure, there is shown in entirely similar manner a second cloud of points together with the curves obtained by the prior art and by the method of the invention. It can be seen that the curves are closely superposed and that the uncertainty about the model is very low. It should be observed that this is explained by the fact that the cloud of points being processed is very regular.

In the top right portion of the figure, there can be seen a cloud of points that are more spread out, for which the prior art method using linear regression in the (Q; $\Delta P2/Q$) space does not give a satisfactory solution. The model 630 that is obtained is an outlier, in particular because the coefficient IPb is negative, which does not correspond to that which is observed in reality. However the invention enables results to be obtained that are very satisfactory, with a bundle of curves 640 that match physical reality and that are indicative of low uncertainty.

In the bottom right portion of the figure, there can be seen a very similar situation in which the prior art method gives an outlier result and the method of the invention gives a result that is entirely satisfactory, with low uncertainty.

Figures 7A, 7B:
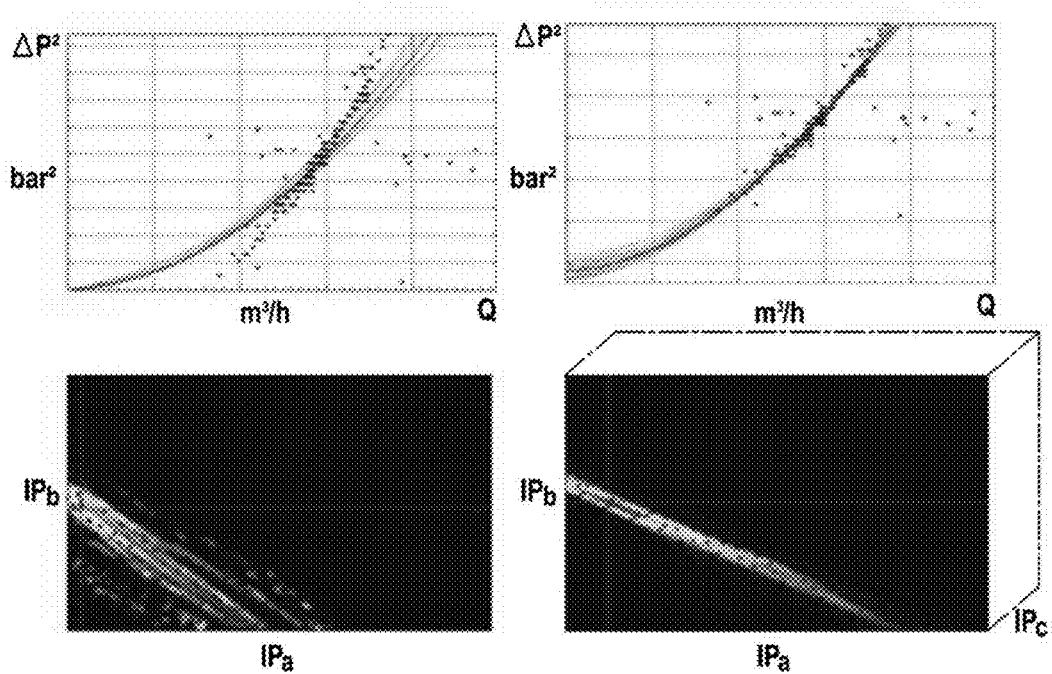
FIG. 7 shows results obtained in a second implementation, and compares them with the results obtained in the first implementation.

FIG. 7a shows results obtained with the first implementation of the invention based on equation (2) for a cloud of points that with equation (2) give high intensity values for pairs (IPa; IPb) in which IPa is negative, and that is not satisfactory, since a model with negative IPa implies that positive flow rates may be associated with negative values for P2.

FIG. 7B shows a situation in which a second implementation of the invention is applied that makes it possible to process such a cloud of points.

In this second implementation, use is made of equation (1) with IPc not necessarily being zero in order to model the data. A human operator selects bottom and top bounds for the coefficients IPa, IPb, and IPc, and for each triplet of coefficients (IPa, IPb, IPc) within the context of these bounds, consideration is given to the parabola of equation:

$$y = IPa \cdot x + IPb \cdot x^2 + IPc$$

The model is referred to as the parabolic model.

The number of points in the cloud of points at a distance from the parabola in question in the (Q; $\Delta P^2$) space that is less than a predetermined value is enumerated. These points are reasonably reproduced by the corresponding model, with a margin of error corresponding to the predetermined value.

The value obtained is representative of the match between the cloud of points and the model, possibly as increased by the above-mentioned weighting if the cloud of points is spread out along the parabola.

For each triplet (IPa, IPb, IPc), the result of the possibly weighted enumeration is transferred in the form of an intensity associated with the corresponding point into the (IPa, IPb, IPc) value space. On a graphics interface, sections of this space are shown, e.g. each obtained for a given value of IPc, and a color code or a brightness is used to represent the intensity in each plane (IPa; IPb) section by section.

The figure shows the results obtained with this second implementation of the invention as described above. As can be seen, consistent results are obtained with low uncertainty.

A human operator or an algorithm then proceeds to use the intensities in the (IPa, IPb, IPc) space to select one or more points corresponding to one or more models of the cloud of points in compliance with equation (1). The selection is made for the purpose of managing the deposit or the stockpile under consideration.

Figure 8:
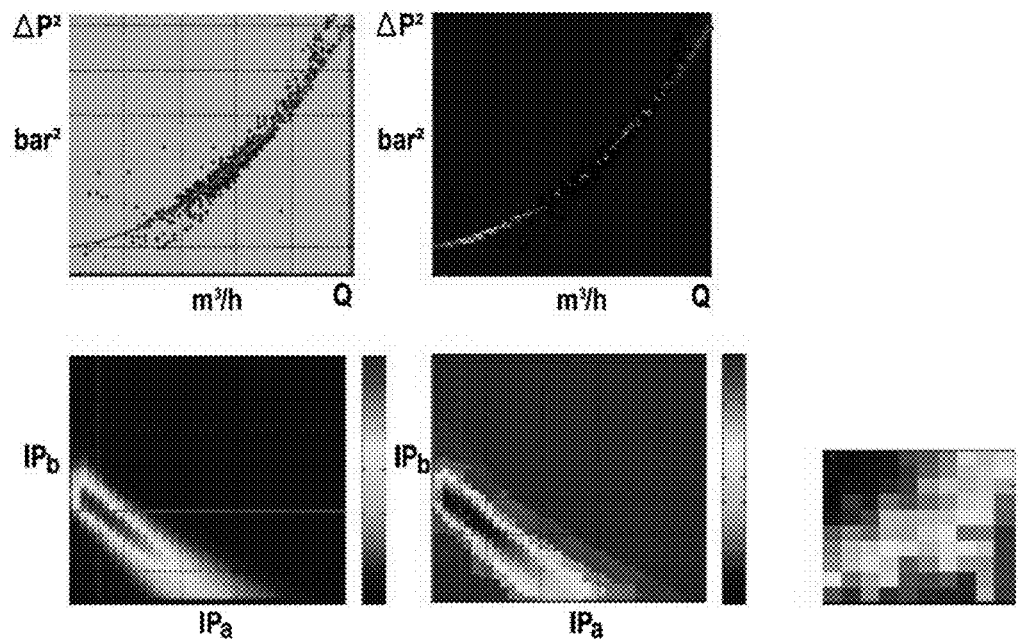
FIG. 8 shows the graphics interface of software for performing the invention.

FIG. 8 shows the graphics interface of software known as RADON IP that implements the invention in an implementation based on equation (2). In the top left portion, there can be seen the (Q; $\Delta P^2$) space in which the cloud of measurement points is shown.

In the bottom left portion, there can be seen the (IPa; IPb) space. The high intensity values form a zone of simple shape, with a single crest line. The result of pointing automatically to the maximum of the intensity values is shown. The corresponding curve is shown in the top left portion of the figure in the (Q; $\Delta P^2$) space, and it can be seen that it does indeed pass through the point (Q=0, $\Delta P^2$).

In the top right portion, the result of the inverse transform is shown. It can be seen that the uncertainty in the resulting model is very low.

Finally, in the bottom left portion, the (IPa; IPb) space is shown with points being distributed by intensity class, the intensity classes being defined by thresholds.

In the bottom right portion, the (IPa; IPb) space is segmented into productivity classes using a topological map classification method (e.g. a self-organizing map (SOM) or other similar methods), the projection of the classes into this topological map being shown in the extreme right-hand portion. This projection makes it easier to select models that are related.

Figure 9:
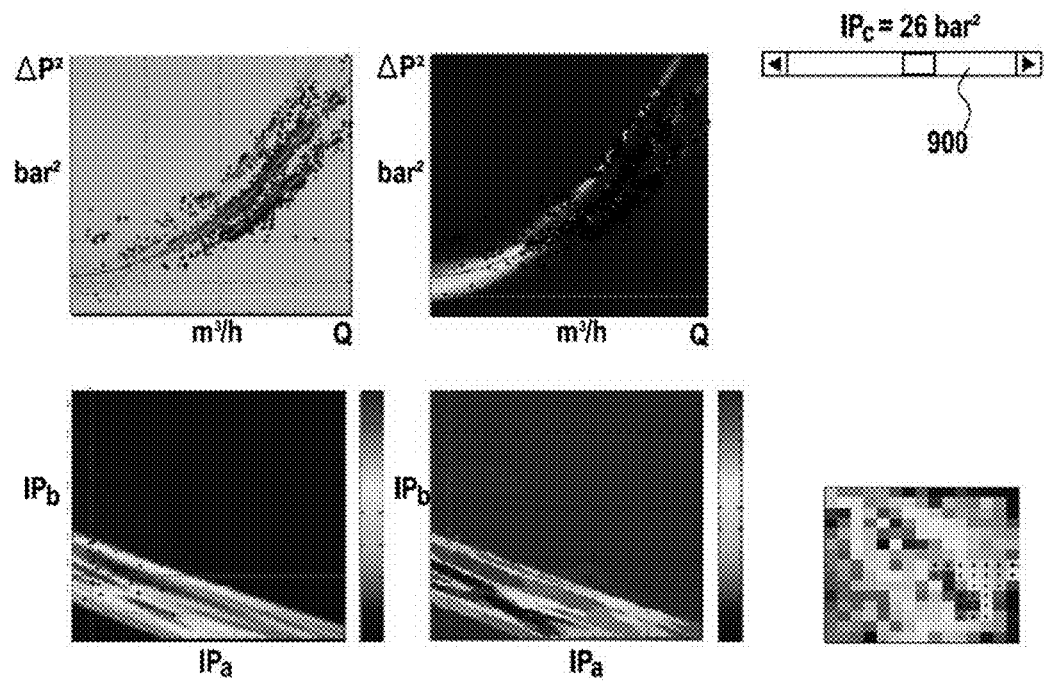
FIG. 9 shows the software in use in a particular implementation of the invention.

FIG. 9 shows the same graphics interface of software implementing the invention, but this time using the implementation based on equation (1). In the top left portion, there can be seen the (Q; $\Delta P2$) space showing the cloud of measurement points. The cloud is more complex than the cloud shown in FIG. 8.

In the bottom left portion, there can be seen the (IPa; IPb) space for a given value of IPc, as selected by the user with a sliding cursor 900 shown in the top right-hand corner of the window of the interface (in the example, a value IPc=26 bar2 has been selected). The high intensity values form a zone of complex shape, with several crest lines and several not correlated high value zones. The corresponding curves are shown in the (Q; $\Delta P2$) space of the top left portion of the figure. It can be seen that in general they do not pass via the point (Q=0, $\Delta P2$). More precisely, in FIG. 9, they pass via the point (Q=0, $\Delta P2$=26 bar2) and they serve to reproduce the non-uniformity of the cloud of points, with three trends that appear for high values of Q, each corresponding to a different range of values for IPb.

In the top left portion, the result of the inverse transform is shown once more. It can be seen that the uncertainty in the resulting model is high, and the three above-mentioned trends can be seen.

In a third implementation of the invention (not shown), use is made of equation (1) written in modified form as follows:

$$\Delta P^2/Q^2 = IPa/Q + IPb + IPc/Q^2 \quad (3)$$

This equation (3) is advantageous if the assumption is not made that the point (Q=0, Pm=Pg) is an operating point. This equation is referred to as the hyperbolic model.

A human operator selects the bottom and top bounds for the coefficients IPa, IPb, and IPc, and for each triplet of coefficients (IPa, IPb, IPc) within these bounds, consideration is given to the hyperbola of equation:

$$y = IPa/x + IPb + IPc/x^2$$

The number of points of distance from the hyperbola under consideration in the (Q; $\Delta P^2/Q^2$) space that is less than a predetermined value is enumerated in order to discover the number of points that are reproduced by the model. Thereafter, one or more models are selected for managing the stockpile or the deposit under consideration on the basis of the enumerations, e.g. by selecting the points (IPa, IPb, IPc) for which the enumeration is the maximum.

In a fourth implementation (likewise not shown), a Radon transform is applied to the cloud of points in the (Q; $\Delta P^2/Q$) space, thereby providing intensities in a two-dimensional space of polar coordinates. Thereafter, the polar coordinates are converted into Cartesian coordinates so as to obtain intensities in a space of Cartesian coordinates (X, Y), in which a point is selected for modeling the cloud of points, on the basis of the intensities.

The invention is not limited to the implementations described and it extends to any variant in the ambit of the scope of the claims. In particular, models that are not based on equation (1) may be used, providing they are satisfactory in terms of the physics of stockpiles.

The invention claimed is:

1. A characterization method for characterizing the performance of wells in an underground gas storage or underground natural reservoir of compressible fluids, the method comprising the steps of:
   taking measurements on the underground gas storage or underground natural reservoir of compressible fluids to obtain a plurality of operating points;
   defining a family of operating models based on selected bottom and top bounds of first and second productivity coefficients;
   for each operating model of the defined family of operating models, enumerating operating points of the plurality of operating points that are reproduced by said operating model, wherein said enumerating comprises integrating the operating points of the plurality of operating points reproduced by the operating model;
   selecting at least one operating model from the defined family of operating models based on said enumerating for managing said underground gas storage or underground natural reservoir of compressible fluids, wherein said selecting comprises:
      generating a respective intensity for each operating model of the defined family of operating models based on said enumerating;
      representing the respective intensity associated with each operating model of the defined family of operating models as a brightness or a color code on a graphical interface displaying a two-dimensional space of the first and second productivity coefficients; and
      selecting a point on the graphical interface corresponding to a high intensity value; and
   controlling flow rates or pressure of the gas storage or underground natural reservoir of compressible fluids using the selected at least one operating model.

2. A characterization method according to claim 1, wherein the operating points are viewed in a space of points, each point having its abscissa proportional to a working flow rate and having its ordinate proportional to the difference between the square of a pressure of a working well and the square of a pressure of a well at rest.

3. A characterization method according to claim 1, wherein the defined family of operating models has, as parameters, two real numerical values.

4. A characterization method according to claim 3, wherein the operating models of the family are linear models.

5. A characterization method according to claim 3, wherein the defining and enumerating comprise applying the Radon transform to the plurality of operating points.

6. A characterization method according to claim 1, wherein the defined family of operating models has, as parameters, three real numerical values.

7. A characterization method according to claim 6, wherein the operating models of the defined family of operating models are parabolic models.

8. A characterization method according to claim 6, wherein the operating models of the defined family of operating models are hyperbolic models.

9. A characterization method according to claim 1, wherein an enumeration result of the enumerating is weighted so as to be greater if the operating points reproduced by the model are dispersed along the model.

10. A characterization method according to claim 1, wherein the selection of the at least one operating model is automatic, at least in part.

11. A characterization method according to claim 1 wherein the selection of the at least one operating model is made manually, at least in part, by a human operator.

12. A characterization method according to claim 1, wherein selecting the at least one operating model comprises identifying at least one maximum from a result of said enumerating.

13. A method of controlling flow rates or pressure in a well in an underground gas storage or underground natural reservoir of compressible fluids, the method using a model selected by a method according to claim 1.

14. A non-transitory computer medium including instructions that, when executed by a processor, leads to performing a method according to claim 1.

15. A characterization method for characterizing the performance of wells in an underground gas storage or underground natural reservoir of compressible fluids, the method comprising the steps of:
   taking measurements on a working well to obtain a plurality of operating points;
   defining a family of operating models, wherein the defined family of operating models have three numerical values as parameters;
   for each operating model of the defined family of operating models, enumerating operating points of the plurality of operating points that are reproduced by said operating model;
   selecting at least one operating model from the defined family of operating models based on said enumerating for managing said underground gas storage or underground natural reservoir of compressible fluids, wherein said selecting comprises:
      generating a respective intensity for each operating model of the defined family of operating models based on said enumerating;
      representing the respective intensity associated with each operating model of the defined family of operating models as a brightness or a color code on a graphical interface displaying a two-dimensional space of the first and second productivity coefficients; and
      selecting a point on the graphical interface corresponding to a high intensity value; and
   controlling flow rates or pressure of the underground gas storage or underground natural reservoir of compressible fluids using the selected at least one operating model.

16. The characterization method of claim 15, wherein the operating models of the defined family of operating models are parabolic models.

17. The characterization method of claim 15, wherein the operating models of the defined family of operating models are hyperbolic models.

18. The characterization method of claim 15, wherein an enumeration result of the enumerating is weighted so as to be greater if the operating points reproduced by the model are dispersed along the model.

19. The characterization method of claim 15, wherein selecting the at least one operating model comprises identifying at least one maximum from a result of said enumerating.

20. The characterization method of claim 15, wherein the defining and enumerating comprise applying the Radon transform to the plurality of operating points.

* * * * *